United States Patent
Behringer et al.

(10) Patent No.: US 7,155,020 B2
(45) Date of Patent: Dec. 26, 2006

(54) AUDIO CIRCUITRY FOR DYNAMICS REDUCTION

(75) Inventors: Uli Behringer, Wanchai (HK); Jan Duwe, Krefeld (DE)

(73) Assignee: Red Chip Company Ltd., Tortola (VG)

( * ) Notice: Subject to any disclaimer, the term of this patent is extended or adjusted under 35 U.S.C. 154(b) by 984 days.

(21) Appl. No.: 09/823,222

(22) Filed: Mar. 29, 2001

(65) Prior Publication Data

US 2001/0033667 A1   Oct. 25, 2001

(30) Foreign Application Priority Data

Mar. 30, 2000 (DE) .................... 100 15 833

(51) Int. Cl.
  *H03F 21/00*  (2006.01)
  *H03F 3/38*   (2006.01)
  *H03F 3/217*  (2006.01)

(52) U.S. Cl. .............. 381/120; 330/10; 330/251

(58) Field of Classification Search ........... 381/120, 381/118, 61, 98, 106
See application file for complete search history.

(56) References Cited

U.S. PATENT DOCUMENTS 3,906,384 A * 9/1975 Schiffman .............. 377/78
4,405,832 A * 9/1983 Sondermeyer ............ 381/61
4,406,001 A * 9/1983 Klasco et al. ............ 369/88
5,442,317 A * 8/1995 Stengel .................... 330/10

OTHER PUBLICATIONS

"Nonlinear Amplifying Circuit," Patent Abstracts of Japan, Publication No. 60093814A, May 25, 1985, p. 1.

* cited by examiner

*Primary Examiner*—Laura A. Grier
(74) *Attorney, Agent, or Firm*—Stoel Rives LLP

(57) ABSTRACT

A circuit for processing an audio signal includes an input stage to which the audio signal is applied and an output at which the processed audio signal is presented. The circuit comprises first and second input stages (11, 12) having nonlinear performance curves, the first stage receiving the audio signal at a specified phase, and the second stage receiving from an inverter (13) an inverse phase of the audio signal. A positive half wave of the input signal is processed nonlinearly and the negative half wave is processed linearly. A difference amplifier (14) receives the signals produced by the first and second input stages and generates an audio signal representing a difference between the signals present at its inputs.

20 Claims, 3 Drawing Sheets

AUDIO CIRCUITRY FOR DYNAMICS REDUCTION

RELATED APPLICATION

This application claims priority under 35 U.S.C. § 119 of German Patent Application No. 100 15 833.1-42, filed Mar. 30, 2000, for NIEDERFREQUENZSCHALTUNG ZUR DYNAMIKBEGRUNZUNG.

TECHNICAL FIELD

This invention relates to a low-frequency circuit for processing audio signals, and in particular to an input stage and/or an impedance transformer for audio devices having an input at which an audio signal is present and an output at which the processed audio signal is present.

BACKGROUND OF THE INVENTION

In conventional audio input stages, in particular in the input stages of musical instrument amplifiers, modules are used for impedance transformation and preamplification. If possible, these modules are operated in their linear operating ranges in order to avoid undesirable distortion products in the output signal. Once this linear working range is left, more-or-less clearly audible and measurable nonlinear distortions occur. To avoid these distortions, measures must be taken to keep the audio input signal below the maximum amplitude that leads to distortions. These measures are either associated with a loss of valuable signal-to-noise ratio or other losses in signal quality.

In the case of electric musical instruments, audio input stages are not only used for the neutral processing or amplification of input signals, they are also used to actively modify sound. To accomplish this, it is necessary in part to transfer extreme transients that have a high dynamic range between the instrument attack and the fundamental tone. With musical instrument amplifiers, the way such dynamic peaks are transferred to a great extent governs the sound of the given device. To achieve the proper transfer, a compromise has to be reached relative to the input amplification. The nature of this compromise is that a portion of the dynamic range—the so-called "headroom"—must be reserved for signal peaks and a somewhat poorer signal-to-noise ratio generally has to be accepted in return. The actual sound is then obtained in the subsequent processing stages, which can involve tone control as well as dynamic compression and distortion. One problem with this approach is that distortion occurs at locations in the circuit that usually have an extremely undesirable effect on the desired result.

Control amplifiers for dynamic compression have been proposed to deal with the problem of dynamic peaks in the processing of audio signals. However, such amplifiers usually have a relatively high level of technical complexity, and they suffer from disadvantages relating to the principle itself—such as audible control processes, slow response, and control intermodulation. The adjustment times required by dynamic compressors, such as, for example, the so-called "attack" and "release", always require that a relatively lengthy portion of the signal relative to the signal peak also be controlled.

SUMMARY OF THE INVENTION

Given this prior art, one of the objects of the various embodiments described herein is to create a low-frequency circuit of the type referred to above that provides a high degree of adjustability combined with a simple, economical design.

In order to achieve high adjustability with a headroom that is typically increased by 6 dB, the circuit provides what amounts to dynamic compression, which in contrast to the previously used signal compression, is essentially limited to the audio signal peaks. Specifically, this compression is achieved by means of (two) nonlinear transfer elements that act on the audio signal in such a way that one of its half waves is processed in a nonlinear manner. Such half-wave-specific signal processing is performed for the non-inverted and the inverted audio signals which are then subjected to a subtraction operation so that the original audio signal is essentially compressed only in the area of its signal peaks. One of the main advantages of this amplitude compression, which is limited to the signal peaks of the audio signal, as compared to conventional control amplifiers, is that the claimed compression that takes place is free from slowness and audible control processes, as well as control intermodulations.

The amplitude compression, which is limited to the signal peaks of the audio signal, is associated with the generation of a relatively low harmonics content, which the human ear does not perceive as distortion, but rather as a 'vitalization" of the signal, since the audio signal is not cut off at a fixed amplitude, but rather has its volume reduced depending on how the nonlinear performance curve of the nonlinear element is set up. An advantage here is that the audio signal retains its original characteristic, but on average has a louder and fresher impact as a result of the harmonics that are generated in the compression process.

The dynamic compression is extremely effective, mainly at capturing the signal peaks from electric instruments, such as electric guitars or electric basses, so that the average signal level and thus the cleanness of the audio signal is improved significantly.

Another important advantage is that the processing of the signal in later signal processing stages encounters fewer problems due to the reduced dynamic range, which results in better use of the resources of equipment employing the circuit.

The low-frequency circuit ensures that the risk of overdriving is much lower than in prior-art circuits of the type being addressed here, which increases the subjective performance of equipment using the circuit of the invention, since these performance limits are not reached until much later.

The components used in the circuit are extremely simple, economical and trouble-free. For example, the nonlinear curves of the input stages of the circuit of the invention can, in the simplest case, be produced by diodes in passive input stages. In the case of passive input stages, amplification is provided in subsequent amplifier stages. Alternatively, other simple nonlinear transfer elements, such as bipolar transistors, FETs, vacuum tubes, etc., may be used in active—i.e., amplifying—input stages.

If the audio signal is to be fed into the circuit in symmetrical form, a special circuit to generate an inverse audio signal is not necessary. In any event, an inverter of this type can be implemented at low-cost and only results in an insignificant increase in cost of the circuit.

Additional reduction of the dynamic range can be achieved by cascading two or more of the low-frequency circuits.

Another advantage involves common mode suppression in the difference amplifier downstream from the input stages.

Such suppression is needed to effectively reduce interference acting on the transmission path. The advantage relates to out-of-phase transmission paths that are combined with one another and is especially important when vacuum tubes circuits are used.

The nonlinear curves of both of the input stages of the circuit of the invention can be modified in virtually an unlimited number of ways so that both the transition from a non-processed audio signal to a processed audio signal and the contents of even-numbered and odd-numbered harmonics can be altered systematically.

The low-frequency circuit for the first time permits dynamic and harmonics processing directly in the input stage and thus provides processing operations in a compact circuit, operations that in the past had to be implemented in the number of different circuits.

We shall now illustrate selected embodiments with reference to the follwing drawings.

DETAILED DESCRIPTION OF PREFERRED EMBODIMENTS

Figure 1:
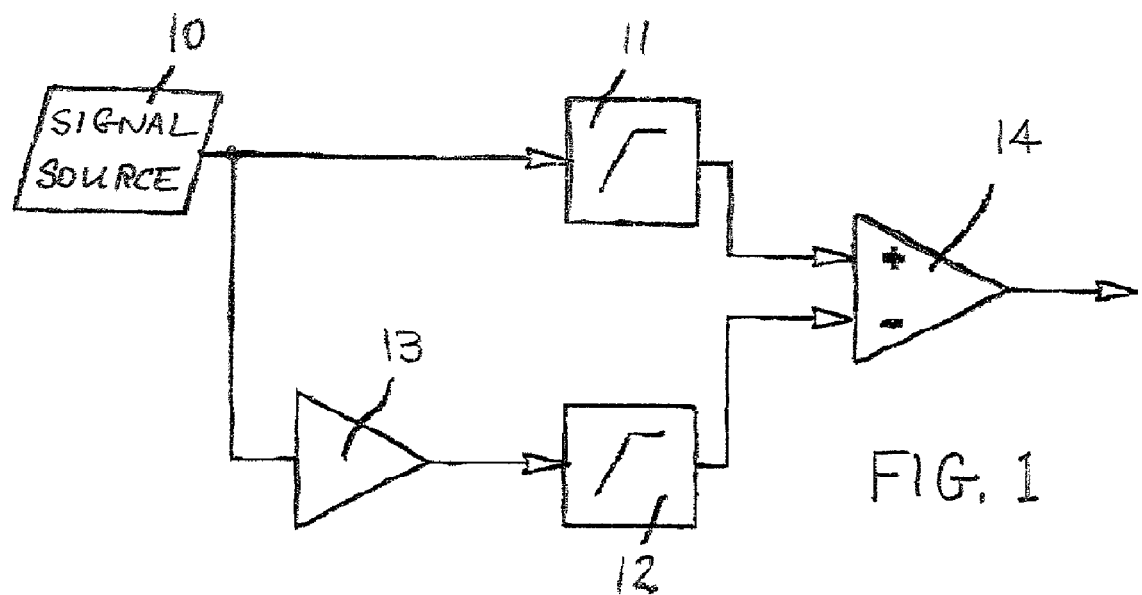
FIG. 1 is a schematic diagram of the general design of a low-frequency circuit according to one embodiment.

FIG. 1 is a schematic diagram that shows the general design of a low-frequency circuit used to process audio signals. An audio signal is supplied by a signal source 10. In the embodiment shown here, this audio signal from signal source 10 has an asymmetrical shape. This means that relative to ground, the(signal source 10 produces an audio signal having a specified phase orientation. This audio signal is supplied to the low-frequency circuit. This circuit comprises a first input stage 11 and a second input stage 12. The two input stages, 11 and 12, preferably are designed in an essentially identical way and essentially have the same nonlinear performance curves. These input stages can be designed as passive elements as will be described below based on FIG. 2. Alternatively, input stages 11 and 12 can be active elements based on amplifiers, etc.

The audio signal supplied by the signal source 10 is fed into the input of input stage 11. An inverter 13 is located ahead of the second input stage 12. This inverter is used to shift the phase orientation of the audio signal supplied to the second input stage 12 by 180 degrees relative to the audio signal supplied by signal source 10.

A difference amplifier 14 is located behind the two input stages 11 and 12. This means that the output of input stage 11 is applied to the non-inverting input of the difference amplifier 14, while the output of the second input stage 12 is applied to the inverting input of the difference amplifier 14. The difference signal generated from the input signals is present at the output of the difference amplifier 14.

Figure 2:
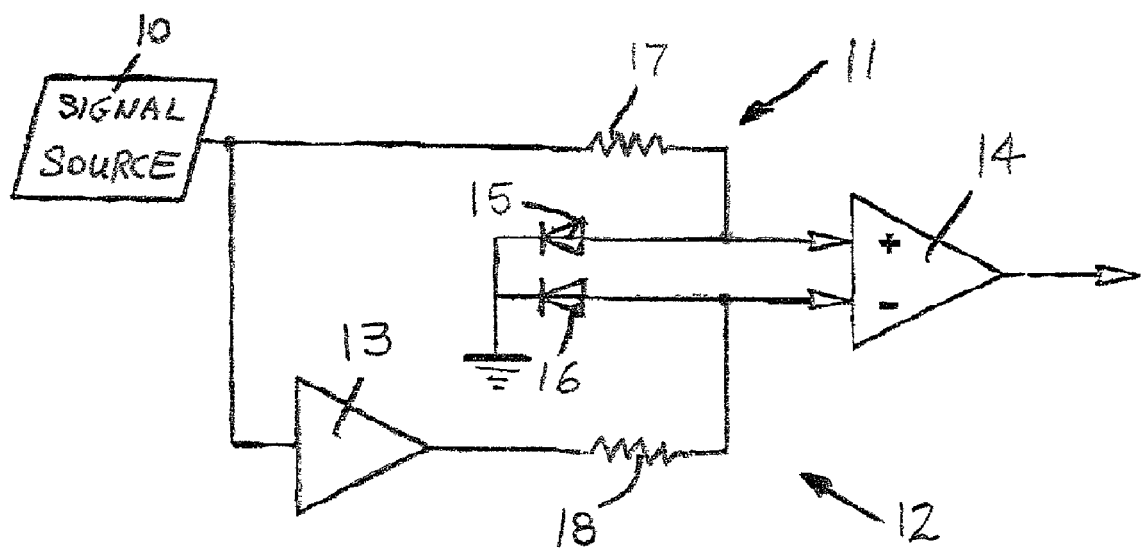
FIG. 2 is a schematic diagram of a specific embodiment of the circuit of FIG. 1 based on diodes that provide nonlinear curves.

FIG. 2 shows a specific embodiment of the circuit of FIG. 1. In cases when the same components are shown, those in FIG. 2 are indicated by the same reference numbers as those in FIG. 1. The nonlinear curve of the two input stages, 11 and 12, is provided in FIG. 2 by nonlinear elements in the form of diodes 15 and 16. Diodes 15 and 16 are grounded at their cathodes. A resistor 17 is attached ahead of the anode of diode 15, which belongs to the first input stage, while a resistor 18 is attached ahead of the anode of diode 16, which belongs to the second input stage 12. The points at which the resistors are connected to the diodes each constitute the output of input stages 11 and 12, while the other resistor connections, 17, 18, constitute the input of input stages 11, 12.

The nonlinear curves of input stages 11 and 12, and diodes 15, 16, respectively, are selected in such a way such that, of the negative and positive half waves of the audio signal, one half wave is processed nonlinearly and the other half wave is processed linearly, or at least nearly so. Thus, in the circuit shown in FIG. 2, the positive half wave of the audio signal that is present at the input of the first input stage 11 is processed nonlinearly, while the corresponding negative half wave is processed linearly. Signal processing in the second input stage 12 occurs in the same manner. The audio signals processed in this way in input stages 11 and 12 are then subtracted in the downstream difference amplifier 14, with the result that a single audio signal is supplied with a compression that is essentially limited to the signal peaks—i.e., to the maximum of the positive half wave and to the minimum of the negative half wave of the audio signal, as will be described in greater detail below based on FIGS. 3–6.

Figure 3:
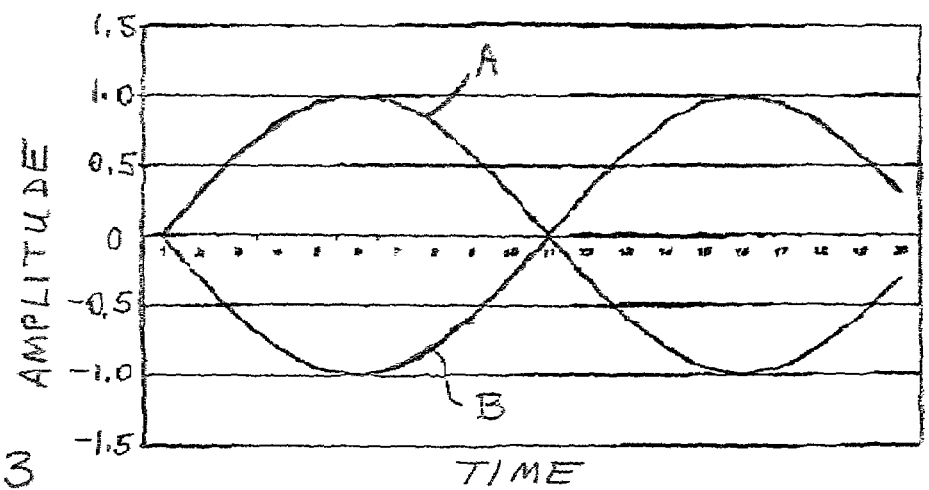
FIGS. 3 to 7 represent signal shapes in the form of amplitude/time diagrams to elucidate the circuit FIG. 1.

FIG. 3 shows the signals at the inputs of input stages 11, 12. The audio signal that is present at input stage 11 is identified by the letter A, while the signal that is present at the second input stage, which is inverse to this first signal, is identified by the letter B. For simplicity's sake, the signals are represented as sine-wave signals.

Figure 4:
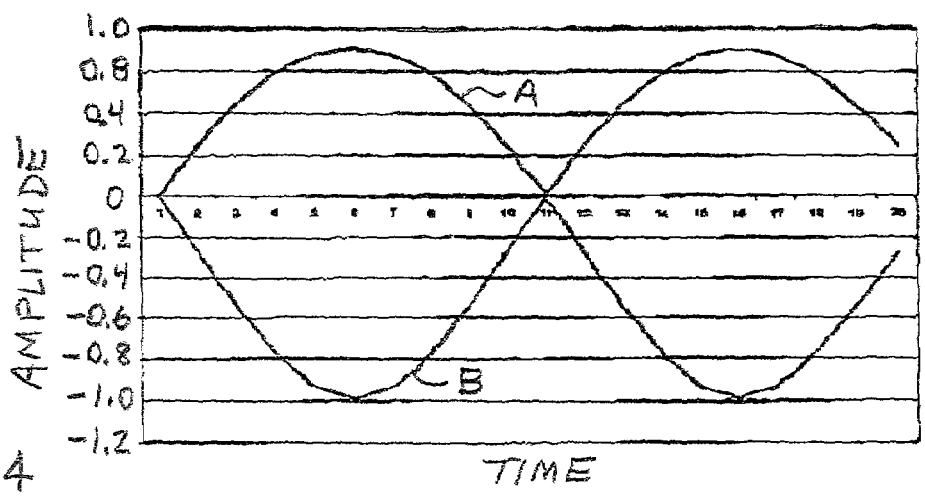

FIG. 4 shows the signals present at the outputs of the two input stages, 11 and 12. In order to better illustrate the resulting processing effect, the amplitude axis is stretched out compared to that shown in FIG. 3. Based on the nonlinear characteristics of the input stages, 11, 12, described above, the positive half waves of signals A and B from FIG. 3 are processed nonlinearly in input stages 11 and 12, i.e., in the area of their peaks they are compressed exponentially and relatively moderately while the general sinusoidal shape is maintained. At the same time, the negative half waves of these signals, A, B, are essentially processed "undistorted" (linearly, or nearly so).

Figure 5:
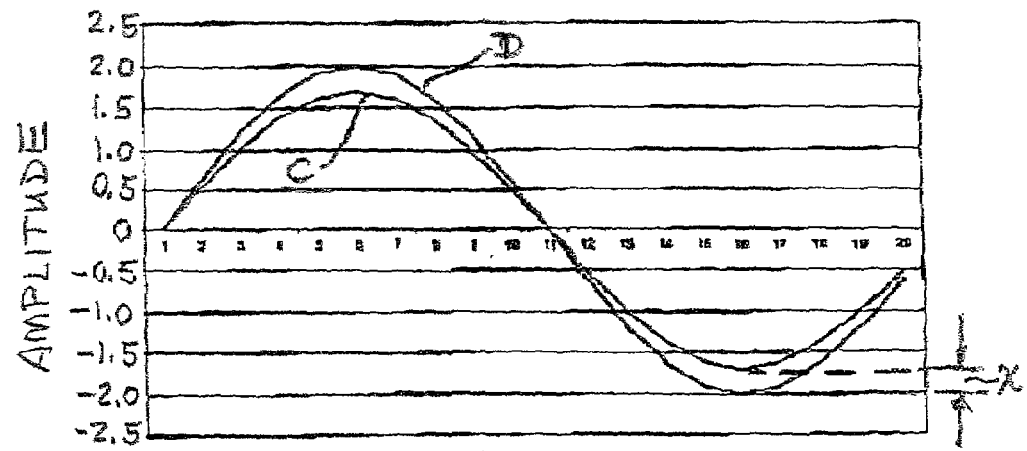

FIG. 5 shows the output signal from difference amplifier 14, at whose two inputs signals A and B from FIG. 4 are applied. The resulting difference signal is identified in FIG. 5 by the letter C, and for comparison purposes, the non-processed audio signal is identified by letter D, which is supplied at the difference amplifier 14 by bypassing input stages 11 and 12. If one compares the curves of signals C and D, it becomes apparent that the audio signal that is partially processed in a nonlinear manner in input stages 11 and 12 is compressed in its peak range at the output of difference amplifier 14. This means that the original sinusoidal curve is changed into a flattened sinusoidal curve through the processing that occurs in input stages 11 and 12. The difference between signals C and D in the range of(their maxima and minima corresponds to an amplitude difference x, which represents the increase in headroom resulting from the processed signal C compared to the unprocessed signal D.

Figure 7:
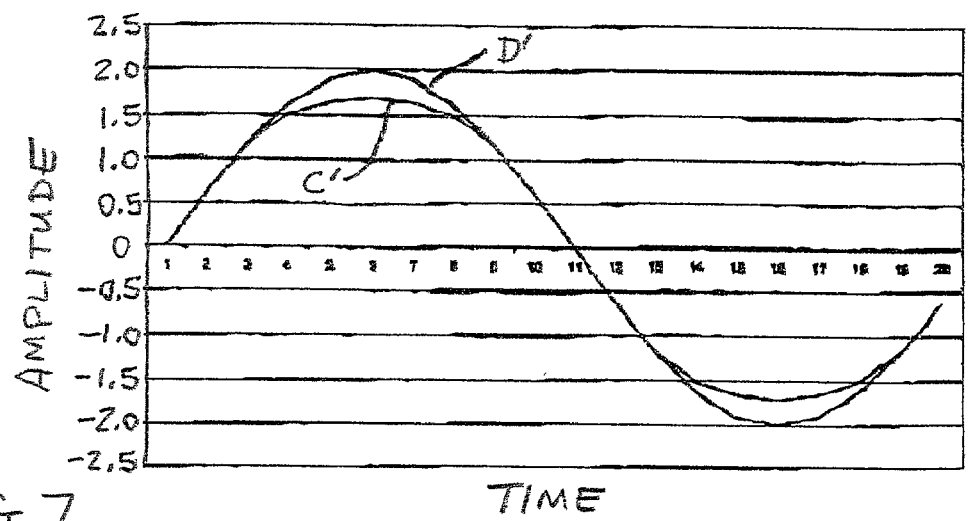
Figure 6:
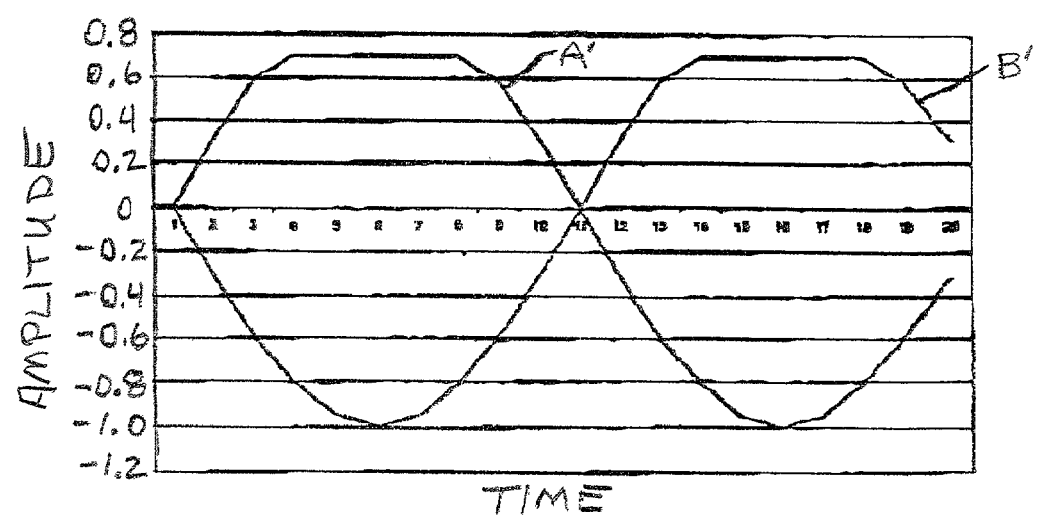

The diagram in FIGS. 6 and 7 corresponds to that in FIGS. 4 and 5, except that the positive half waves of signals A' and B' are no longer distorted in a moderately exponential manner, but rather are severely distorted corresponding to the typical "clipping" that occurs in conventional circuits, with a noticeable deviation from the sinusoidal shape. Even in this extreme case, the difference amplifier 14 generates output signal C' from input signals A' and B' in input stages 11 and 12, and C' is only compressed at its signal peaks. There are no signs that the positive half waves of signals A' and B' are being translated.

The circuit is not limited to merely being used to process audio signals in the low-frequency range, it can also be used to process high-frequency signals.

It will be obvious to those having skill in the art that many changes may be made to the details of the above-described embodiments of this invention without departing from the underlying principles thereof. Accordingly, it will be appreciated that this invention is also applicable to signal conditioning applications other than those found in musical instrument amplifiers. The scope of this invention should, therefore, be determined only by the following claims.

We claim:

1. A circuit for processing a received audio signal including an input stage for receiving the received audio signal and an output for presenting a processed audio signal, comprising:
    a signal source providing the received audio signal having positive and negative wave portions;
    first and second input stages having substantially identical nonlinear performance curves, the first input stage receiving the received audio signal, and the second input stage receiving an inverse of the received audio signal, the first and second input stages having operating characteristics selected such that of the positive and negative wave portions, one of the portions is processed substantially nonlinearly and the other of the portions is processed substantially linearly; and
    a difference amplifier receiving the processed portions from the first and second input stages and producing the processed audio signal.

2. The circuit of claim 1, wherein the first and second input stages comprise passive circuits for generating the nonlinear performance curves.

3. The circuit of claim 2, wherein the passive circuits comprise diodes.

4. The circuit of claim 1, wherein the first and second input stages comprise amplifiers having nonlinear performance curves.

5. The circuit of claim 1, wherein an inverter circuit provides the inverse input signal for the second input stage.

6. The circuit of claim 1, wherein the difference amplifier is operated in a linear range.

7. The circuit of claim 1, wherein said circuit has a high input impedance for uncoupling it from the signal source.

8. The circuit of claim 1, wherein said circuit is cascaded to achieve a greater dynamic signal compression.

9. The circuit of claim 1, in which the signal source includes an electrical musical instrument.

10. The circuit of claim 1, in which the processed audio signal has a headroom that is at least about 6 dB greater than a headroom of the received audio signal.

11. A method comprising:
    receiving an input signal having a first polarity portion and a second polarity portion;
    inverting the input signal, thereby generating an inverted signal having a first polarity portion and a second polarity portion;
    processing the first polarity portions of the input signal and the inverted signal substantially linearly;
    processing the second polarity portions of the input signal and the inverted signal substantially nonlinearly;
    whereby the processing steps result in a processed input signal and a processed inverted signal, both of which having linearly processed first polarity portions and nonlinearly processed second polarity portions; and
    forming a difference between the processed input signal and the processed inverted signal, thereby generating a difference signal.

12. A method according to claim 11, wherein the processing step are performed in accordance with different respective control points of the same performance curve.

13. A method according to claim 11, wherein the processing step are performed passively.

14. A method according to claim 11, wherein the audio signal is generated by an electrical musical instrument.

15. A method according to claim 11, further comprising:
    repeating the receiving, the inverting, both processing, and the forming steps, wherein the processed audio signal is used as the input audio signal in the repetition of the steps.

16. A system comprising:
    a means for receiving an input signal having a first polarity portion and a second polarity portion;
    a means for inverting the input signal, thereby generating an inverted signal having a first polarity portion and a second polarity portion;
    a means for processing the first polarity portions of the input signal and the inverted signal substantially linearly;
    a means for processing the second polarity portions of the input signal and the inverted signal substantially nonlinearly;
    whereby the processing steps result in a processed input signal and a processed inverted signal, both of which having linearly processed first polarity portions and nonlinearly processed second polarity portions; and
    a means for forming a difference between the processed input signal and the processed inverted signal, thereby generating a difference signal.

17. A method according to claim 11, wherein the first polarity wave portion is a positive wave portion and the second polarity wave portion is a negative wave portion.

18. A method according to claim 11, wherein the first polarity wave portion is a negative wave portion and the second polarity wave portion is a positive wave portion.

19. A system according to claim 16, wherein the first polarity wave portion is a negative wave portion and the second polarity wave portion is a positive wave portion.

20. A system according to claim 16, wherein the first polarity wave portion is a positive wave portion and the second polarity wave portion is a negative wave portion.

* * * * *